(12) United States Patent
Kajiyama

(10) Patent No.: US 8,497,979 B2
(45) Date of Patent: Jul. 30, 2013

(54) EXPOSURE METHOD AND EXPOSURE APPARATUS

(75) Inventor: Koichi Kajiyama, Yokohama (JP)

(73) Assignee: V Technology Co., Ltd., Yokohama-shi (JP)

( * ) Notice: Subject to any disclaimer, the term of this patent is extended or adjusted under 35 U.S.C. 154(b) by 0 days.

(21) Appl. No.: 13/251,850

(22) Filed: Oct. 3, 2011

(65) Prior Publication Data

US 2012/0113403 A1 May 10, 2012

Related U.S. Application Data

(63) Continuation of application No. PCT/JP2010/054565, filed on Mar. 17, 2010.

(30) Foreign Application Priority Data

Apr. 3, 2009 (JP) .................................. 2009-090617

(51) Int. Cl.
G03B 27/42 (2006.01)
G03B 27/72 (2006.01)
G03F 7/20 (2006.01)

(52) U.S. Cl.
CPC .......... *G03F 7/7055* (2013.01); *G03F 7/70358* (2013.01)
USPC ............................................. 355/71; 355/53

(58) Field of Classification Search
CPC .............................. G03F 7/7055; G03F 7/70358
USPC .................................................. 355/53, 67, 71
See application file for complete search history.

(56) References Cited

U.S. PATENT DOCUMENTS

| 5,677,754 | A | * | 10/1997 | Makinouchi | ..................... 355/53 |
| 6,078,381 | A | * | 6/2000 | Suzuki | ............................. 355/53 |
| 6,160,611 | A | * | 12/2000 | Miyake | ........................... 355/53 |
| 6,411,364 | B1 | * | 6/2002 | Suzuki | ............................. 355/53 |

(Continued)

FOREIGN PATENT DOCUMENTS

JP 06232031 A * 8/1994
JP 07094387 A * 4/1995

(Continued)

OTHER PUBLICATIONS

English-language translation of International Search Report from the Japanese Patent Office for International Application No. PCT/JP2010/054565, mailing date Jun. 22, 2010.

*Primary Examiner* — Steven H Whitesell Gordon
(74) *Attorney, Agent, or Firm* — Finnegan, Henderson, Farabow, Garrett & Dunner, L.L.P.

(57) ABSTRACT

In the present invention, when exposure on a first exposure area of the subject to be exposed by using a first mask pattern group of a photomask, is completed, the shutter is moved in synchronization with a conveying speed of the subject to be exposed to shut off source light, the subject to be exposed is returned by a distance in which the subject to be exposed moves while the shutter moves, and the mask pattern group is switched to a second mask pattern group by moving the photomask. When the switching of the mask pattern group of the photomask is completed, the conveying of the subject to be exposed is restarted. At the same time, the shutter is moved in synchronization with the conveying speed of the subject to be exposed to release the shut off of the source light, and exposure on a second exposure area is performed.

4 Claims, 6 Drawing Sheets

U.S. PATENT DOCUMENTS

| | | | |
|---|---|---|---|
| 6,608,665 B1 * | 8/2003 | Nishi et al. | 355/53 |
| 2007/0013894 A1 * | 1/2007 | Loopstra | 355/72 |
| 2007/0242249 A1 * | 10/2007 | Shibazaki et al. | 355/55 |

FOREIGN PATENT DOCUMENTS

| | | | |
|---|---|---|---|
| JP | 11-052583 | | 2/1999 |
| JP | 2001305747 A | * | 11/2001 |
| JP | 2002-099097 | | 4/2002 |
| JP | 2007193154 A | * | 8/2007 |
| JP | 2007-281317 | | 10/2007 |
| JP | 2008-310217 | | 12/2008 |
| JP | 2009-058666 | | 3/2009 |
| WO | WO 2007049436 A1 | * | 5/2007 |

* cited by examiner

→ A(C)

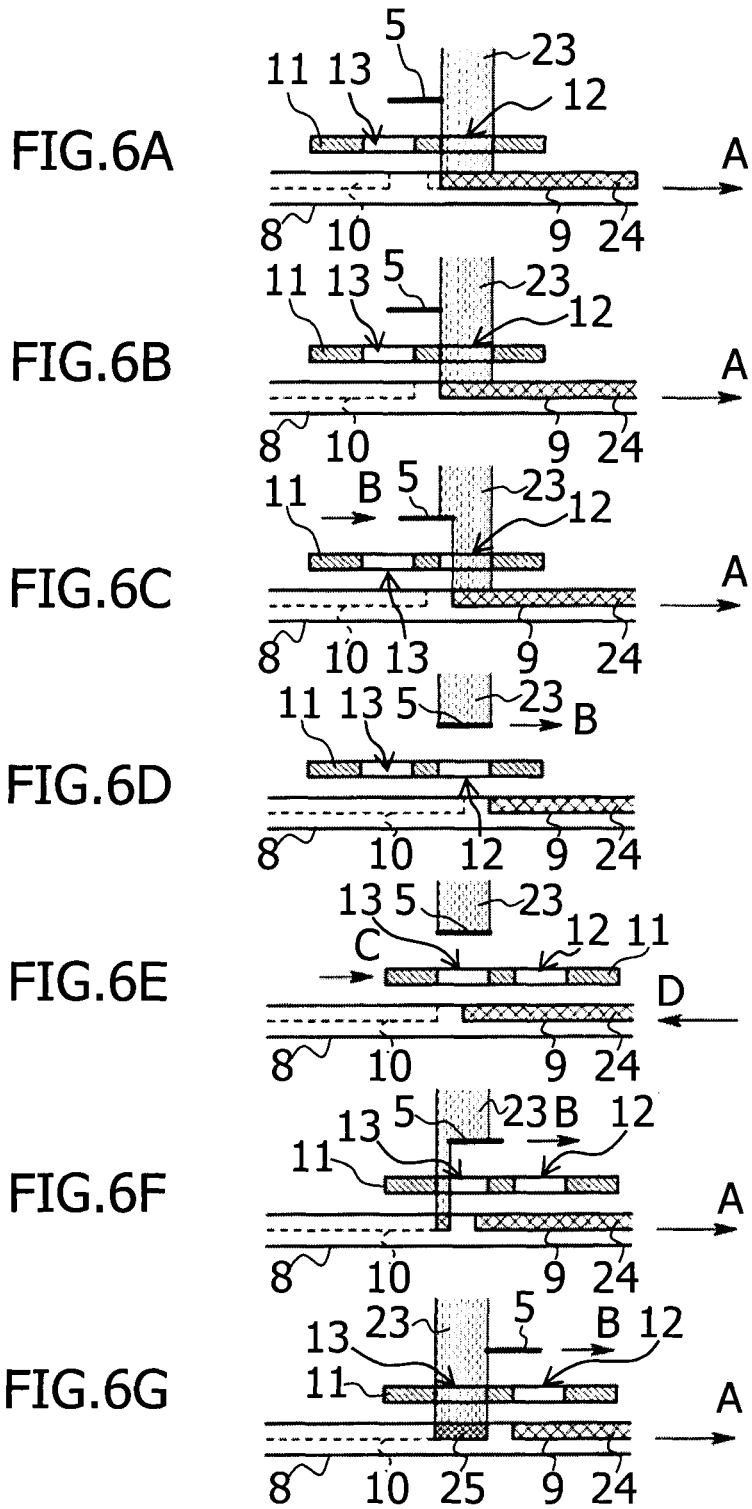

EXPOSURE METHOD AND EXPOSURE APPARATUS

This application is a continuation of PCT/JP2010/054565, filed on Mar. 17, 2010.

BACKGROUND OF THE INVENTION

1. Field of the Invention

The present invention relates to an exposure method and an exposure apparatus for forming a different exposure pattern on each of a plurality of exposure areas set on a subject to be exposed while conveying the subject to be exposed in one direction. In particular, the invention relates to an exposure method and an exposure apparatus for enhancing formation efficiency of a plurality of types of exposure patterns.

2. Description of Related Art

Conventionally, in this type of exposure method, while a subject to be exposed is being conveyed in one direction, one mask pattern group of a photomask is selected and one exposure pattern group is formed on a predetermined exposure area of a subject to be exposed by exposure using the one mask pattern group. Next, the subject to be exposed is returned to a stand-by position at which the subject to be exposed is positioned before starting exposure, and then, the mask pattern group of the photomask is switched to another mask pattern group, and thereafter, the subject to be exposed is conveyed again and another exposure pattern group is formed on another exposure area of the subject to be exposed by exposure using the another mask pattern group (for example, see Japanese Laid-Open Patent Publication No. 2008-310217).

However, in such a conventional exposure method, every time the exposure by one mask pattern group is completed, the subject to be exposed is returned to the standby position at which the subject to be exposed is positioned before the exposure is started, so that the more the types of the exposure patterns to be formed, the longer the total movement distance in which the subject to be exposed moves until all exposures to the subject to be exposed are completed. Therefore, when a plurality of exposure patterns is formed on the same subject to be exposed, there is a problem that the formation efficiency of exposure patterns is low.

Therefore, in view of the above-mentioned problems, an object of the present invention is to provide an exposure method and an exposure apparatus for enhancing the formation efficiency of a plurality of types of exposure patterns on the same subject to be exposed.

SUMMARY OF THE INVENTION

In order to achieve the above object, the exposure method according to the present invention is a method for forming a different exposure pattern on each of a plurality of exposure areas set on a subject to be exposed in a conveying direction of the subject to be exposed at a predetermined interval while conveying the subject to be exposed in one direction, and the exposure method includes the steps of: moving a shutter in synchronization with a conveying speed of the subject to be exposed and shutting off source light when exposure on one exposure area of the subject to be exposed is completed, the exposure being performed by using one mask pattern group of a photomask in which a plurality of types of mask pattern groups corresponding to each exposure pattern is arranged and formed in the conveying direction of the subject to be exposed at a predetermined interval: returning the subject to be exposed in a direction opposite to the conveying direction by a distance in which the subject to be exposed moves while the shutter moves and switching the mask pattern group from the one mask pattern group to another mask pattern group by moving the photomask; and restarting the conveying of the subject to be exposed in the conveying direction and at the same time moving the shutter in synchronization with the conveying speed of the subject to be exposed to release shut-off of the source light, and exposure on the following exposure area is performed when the switching the mask pattern group from the one mask pattern group of the photomask to another mask pattern group is completed.

By the above-mentioned configuration, when exposure on one exposure area of the object to be exposed is completed, the exposure being performed while conveying the subject to be exposed in one direction by using one mask pattern group of the photomask in which a plurality of types of mask pattern groups corresponding to each exposure pattern are formed, the shutter is moved in synchronization with the conveying speed of the subject to be exposed and the source light is shut off, the subject to be exposed is returned in a direction opposite to the conveying direction by the distance in which the subject to be exposed moves while the shutter moves, and the one mask pattern group is switched to another mask pattern group by moving the photomask. When the switching the mask pattern group from the one mask pattern group of the photomask to another mask pattern group is completed, the conveying of the subject to be exposed in the conveying direction is restarted, and at the same time, the shutter is moved in synchronization with the conveying speed of the subject to be exposed to release shut-off of the source light, exposure on the following exposure area is performed, and different exposure patterns are formed for each of a plurality of exposure areas set on the subject to be exposed in the conveying direction of the subject to be exposed at a predetermined interval.

The shutter is moved in the conveying direction of the subject to be exposed.

Furthermore, the shutter includes a plurality of light shielding portions and opening portions alternately arranged in the conveying direction of the subject to be exposed. Thereby, the plurality of light shielding portions and opening portions are alternately switched to each other by moving the shutter in the conveying direction of the subject to be exposed.

The exposure apparatus according to the present invention is an exposure apparatus for forming a different exposure pattern on each of a plurality of exposure areas set on a subject to be exposed in a conveying direction of the subject to be exposed at a predetermined interval while conveying the subject to be exposed in one direction, and the exposure apparatus includes: a conveying device which conveys the subject to be exposed at a predetermined speed; a shutter which is formed to be able to move in synchronization with a movement of the subject to be exposed and which shuts off source light and releases shut-off of the source light; and a mask stage which is arranged to face an upper surface of the conveying device and which holds a photomask in which a plurality of types of mask pattern groups corresponding to each exposure pattern are formed and the mask stage moves to perform switching of the plurality of types of mask pattern groups. The shutter is moved to shut off the source light when exposure on one exposure area of the subject to be exposed is completed, the exposure being performed by using one mask pattern group of the photomask. The conveying device returns the subject to be exposed in a direction opposite to the conveying direction by a distance in which the subject to be exposed moves while the shutter moves, and the one mask pattern group of the photomask is switched to another mask pattern group by moving the mask stage. The conveying of the subject to be exposed in the conveying direction is restarted, and at the same time, the shutter is moved to release shut-off of the source light, and exposure on the following exposure area is performed.

By the above-mentioned configuration, when exposure on one exposure area of the subject to be exposed is completed, the exposure being performed by using one mask pattern group of the photomask while conveying the exposure to be exposed in one direction at a predetermined speed, the shutter is moved in synchronization with the movement of the exposure to be exposed to shut off the source light, the subject to be exposed is returned by the conveying device in the direction opposite to the conveying direction by the distance in which the subject to be exposed moves while the shutter moves, the one mask pattern group is switched to another mask pattern group by moving the mask stage, the conveying of the subject to be exposed in the conveying direction is restarted by the conveying device, and at the same time, the shutter is moved in the movement direction of the subject to be exposed in synchronization with the movement of the subject to be exposed to release shut-off of the source light, and then, exposure on the following exposure area is performed, so that different exposure patterns are formed for each of a plurality of exposure areas set on the subject to be exposed in the conveying direction of the subject to be exposed at a predetermined interval.

Furthermore, the shutter is moved in the conveying direction of the subject to be exposed.

The shutter includes a plurality of light shielding portions and opening portions alternately arranged in the conveying direction of the subject to be exposed. Thereby, the plurality of light shielding portions and opening portions is alternately switched to each other by moving the shutter in the conveying direction of the subject to be exposed.

According to a first or fourth aspect of the present invention, each time the exposure of one exposure pattern with respect to one exposure area is completed, the subject to be exposed is returned by the distance in which the subject to be exposed moves while the shutter moves and exposure of another exposure pattern is performed on a new exposure area by switching the mask pattern group of the photomask, so that the movement distance of the subject to be exposed returned in the direction opposite to the conveying direction of the subject to be exposed is significantly smaller than that of the conventional art. Therefore, the total movement distance of the subject to be exposed until all the exposure is completed is significantly shorter than that of the conventional art. Thus, the formation efficiency of a plurality of types of exposure patterns on the same subject to be exposed is further enhanced compared with that of the conventional art.

According to a second or fifth aspect of the present invention, it is possible to form a proximity exposure apparatus in which a photomask is arranged to approach and face the subject to be exposed.

Furthermore, according to a third or sixth aspect of the present invention, when different exposure patterns are exposed on three or more exposure areas of the subject to be exposed, only an operation in which the shutter is moved in one direction and a plurality of opening portions and light shielding portions are switched needs to be performed, so that the drive operation control of the shutter is easily performed.

BRIEF DESCRIPTION OF THE DRAWINGS

FIG. 6 is an explanatory view of the exposure method of the present invention.

DESCRIPTION OF THE PREFERRED EMBODIMENT

Figure 1:
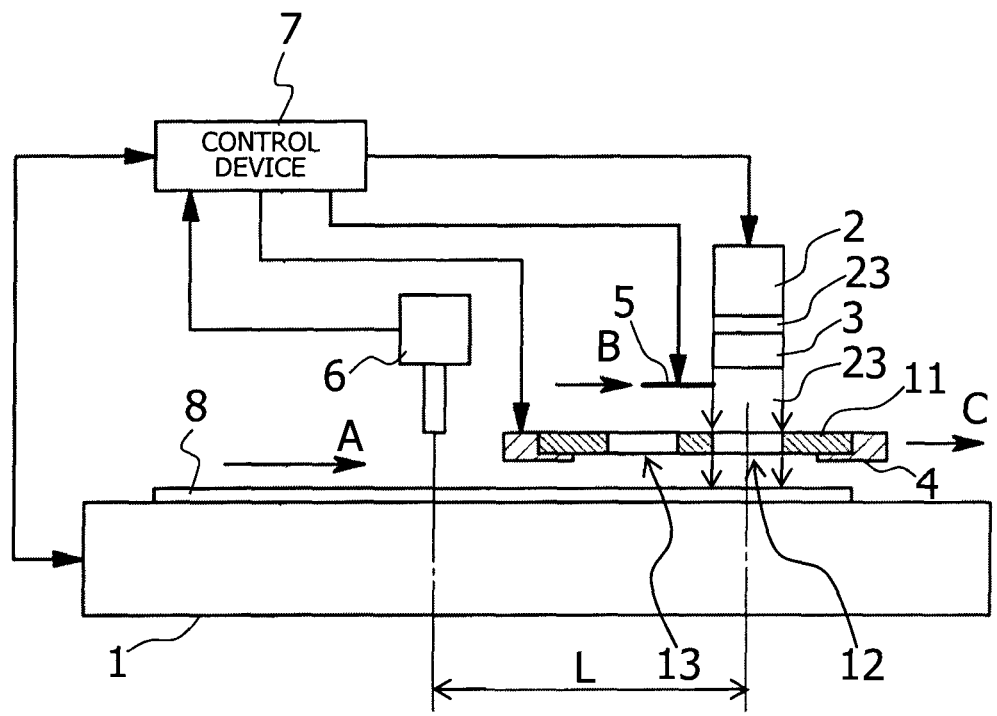
FIG. 1 is a schematic view of an embodiment of an exposure apparatus according to the embodiment of the present invention.

Hereinafter, an embodiment of the present invention will be described in detail with reference to the attached drawings. FIG. 1 is a schematic view of the embodiment of an exposure apparatus according to the present invention. The exposure apparatus forms a different exposure pattern on each of a plurality of exposure areas set on a subject to be exposed while conveying the subject to be exposed in one direction. The exposure apparatus includes a conveying device 1, a light source 2, a coupling optical system 3, a mask stage 4, a shutter 5, an imaging device 6, and a control device 7.

The conveying device 1 conveys a subject to be exposed 8 placed on an upper surface of the conveying device 1 in a direction indicated by an arrow A at a predetermined speed. The conveying device 1 emits air from the upper surface as well as absorbs air. Thus, emission power and absorption power of the air are controlled to float the subject to be exposed 8 by a predetermined amount. In this state, both ends of the subject to be exposed 8 are held by conveying rollers not shown in FIG. 1 to convey the subject to be exposed 8. The conveying device 1 is provided with a speed sensor for detecting a moving speed of the subject to be exposed 8 and a position sensor (not shown in FIG. 1) for detecting the position of the subject to be exposed 8.

Figure 2:
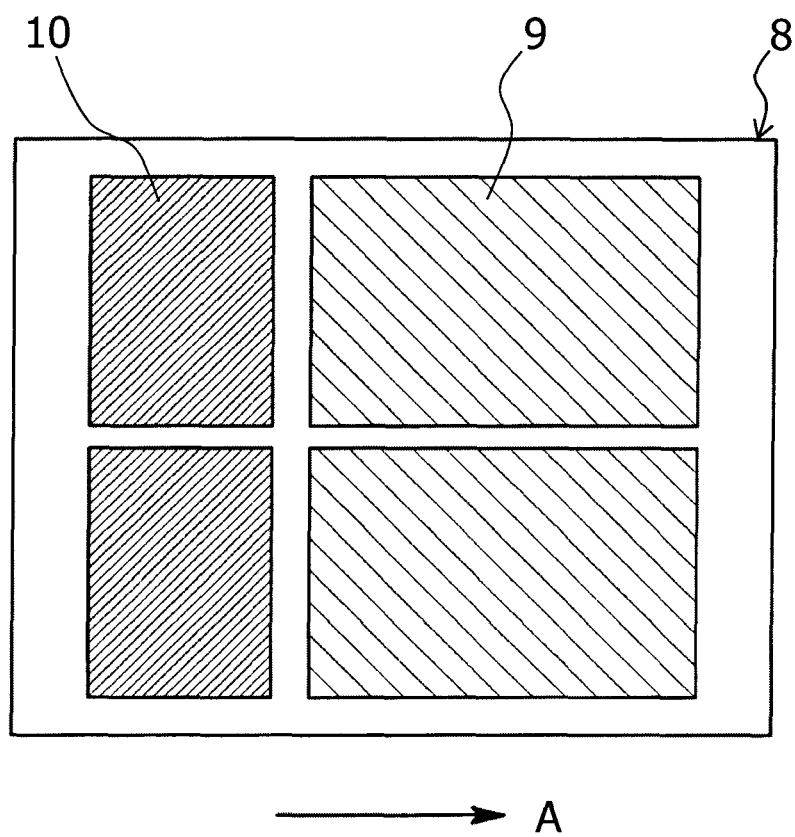
FIG. 2 is a plan view of a setting example of exposure areas set on a surface of a subject to be exposed used in the exposure apparatus.

As shown in FIG. 2, on the subject to be exposed 8 used here, a first exposure area 9 in which a first exposure pattern group is formed and a second exposure area 10 in which a second exposure pattern group is formed are set in advance in a conveying direction (arrow A direction) at a predetermined interval. For example, the subject to be exposed 8 is a color filter substrate.

The light source 2 is provided above the conveying device 1. The light source 2 emits ultraviolet light as source light 23. The light source 2 is a xenon lamp, an extra high pressure mercury lamp, a laser light source, or the like.

The coupling optical system 3 is provided in front of a light emitting direction of the light source 2. The coupling optical system 3 converts the source light 23 emitted from the light source 2 into parallel light and irradiates the parallel light to a mask pattern group of a photomask 11 described below. The coupling optical system 3 includes optical components such as a photo integrator and a condenser lens.

Figure 3:
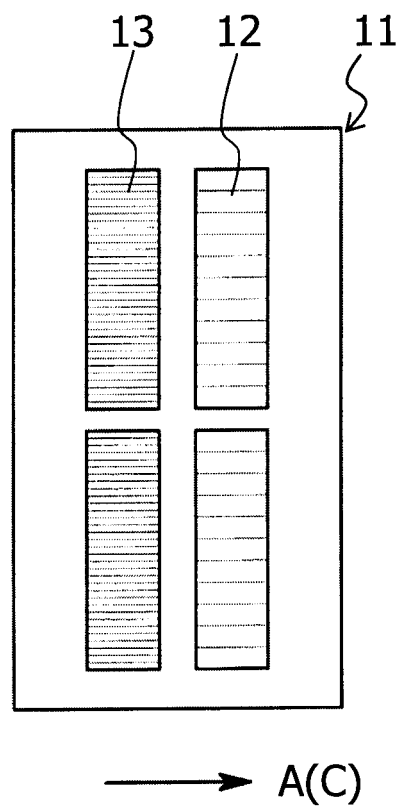
FIG. 3 is a plan view of a configuration example of a photomask used in the exposure apparatus.

The mask stage 4 is provided to face the upper surface of the conveying device 1. The mask stage 4 holds outer edges of the photomask 11 on which a first and a second mask pattern groups 12 and 13 corresponding to the first and the second exposure pattern groups, respectively, different from each other formed on the subject to be exposed 8 are arranged and formed in the conveying direction (arrow A direction) of the subject to be exposed 8 at a predetermined interval as shown in FIG. 3. The mask stage 4 is formed to be able to move in the same direction (arrow C direction) as the conveying direction of the subject to be exposed 8 indicated by the arrow A.

The shutter 5 is provided between the coupling optical system 3 and the mask stage 4. The shutter 5 shuts off and releases the source light 23 irradiated to the photomask 11. The shutter 5 is formed to be able to move in the same direction (arrow B direction) as the conveying direction of the subject to be exposed 8 indicated by the arrow A in synchronization with the movement of the subject to be exposed 8.

The imaging device 6 is provided to be able to capture an image of a position a predetermined distance away from an exposure position of the photomask 11 in the direction opposite to the conveying direction (arrow A direction). The imaging device 6 captures an image of the surface of the subject to be exposed 8. The imaging device 6 is a line camera in which a plurality of light receiving elements are linearly aligned in a direction substantially perpendicular to the conveying direction in the plane parallel to the upper surface of the conveying device 1. Specifically, the imaging device 6 is arranged to capture an image of a position away from an exposure center position of the mask pattern group of the photomask 11 by a distance L in the direction opposite to the conveying direction.

Figure 4:
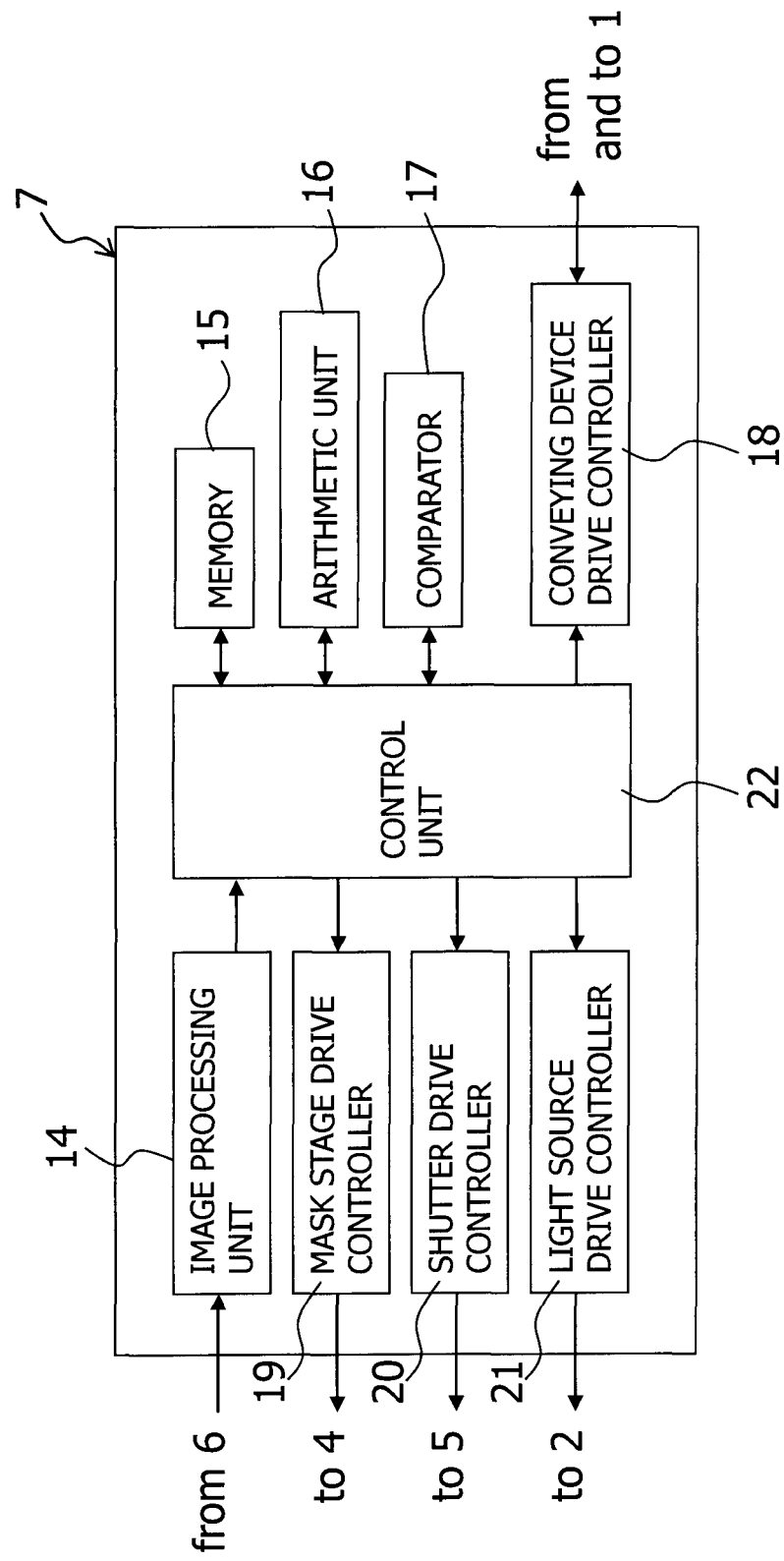
FIG. 4 is a block diagram of a schematic configuration of a control device of the exposure apparatus.

The control device 7 is electrically connected to the conveying device 1, the light source 2, the mask stage 4, the shutter 5, and the image pickup means 6. The control device 7 appropriately controls the movements of the conveying device 1, the mask stage 4, and the shutter 5. As shown in FIG. 4, the control device 7 includes an image processing unit 14, a memory 15, an arithmetic unit 16, a comparator 17, a conveying device drive controller 18, a mask stage drive controller 19, a shutter drive controller 20, a light source drive controller 21, and a control unit 22.

Here, the image processing unit 14 performs image processing on an image of the surface of the subject to be exposed 8 captured by the imaging device 6 and detects the front positions of the exposure areas 9 and 10 in the conveying direction. The memory 15 stores the lengths of the exposure areas 9 and 10 in the arrow A direction, the distance L between the exposure center position of the photomask 11 and the image capturing position of the imaging device 6, and the like, and temporarily stores a calculation result of the arithmetic unit 16 described below. Furthermore, the arithmetic unit 16 calculates the movement distance of the subject to be exposed 8 on the basis of an output of the position sensor of the conveying device 1. Furthermore, the comparator 17 compares the movement distance of the conveying device 1 calculated by the arithmetic unit 16 with the each length read from the memory 15. The conveying device drive controller 18 controls forward drive and reverse drive of the conveying device 1. The mask stage drive controller 19 moves the mask stage 4 and switches the mask pattern group of the photomask 11 from the first mask pattern group 12 to the second mask pattern group 13. The shutter drive controller 20 moves the shutter 5 in synchronization with a conveying speed of the subject to be exposed 8. Furthermore, the light source drive controller 21 controls drive to turn on and off the light source 2. The control unit 22 integrally controls the entire apparatus so that the constituent elements described above are appropriately driven.

Figure 5:
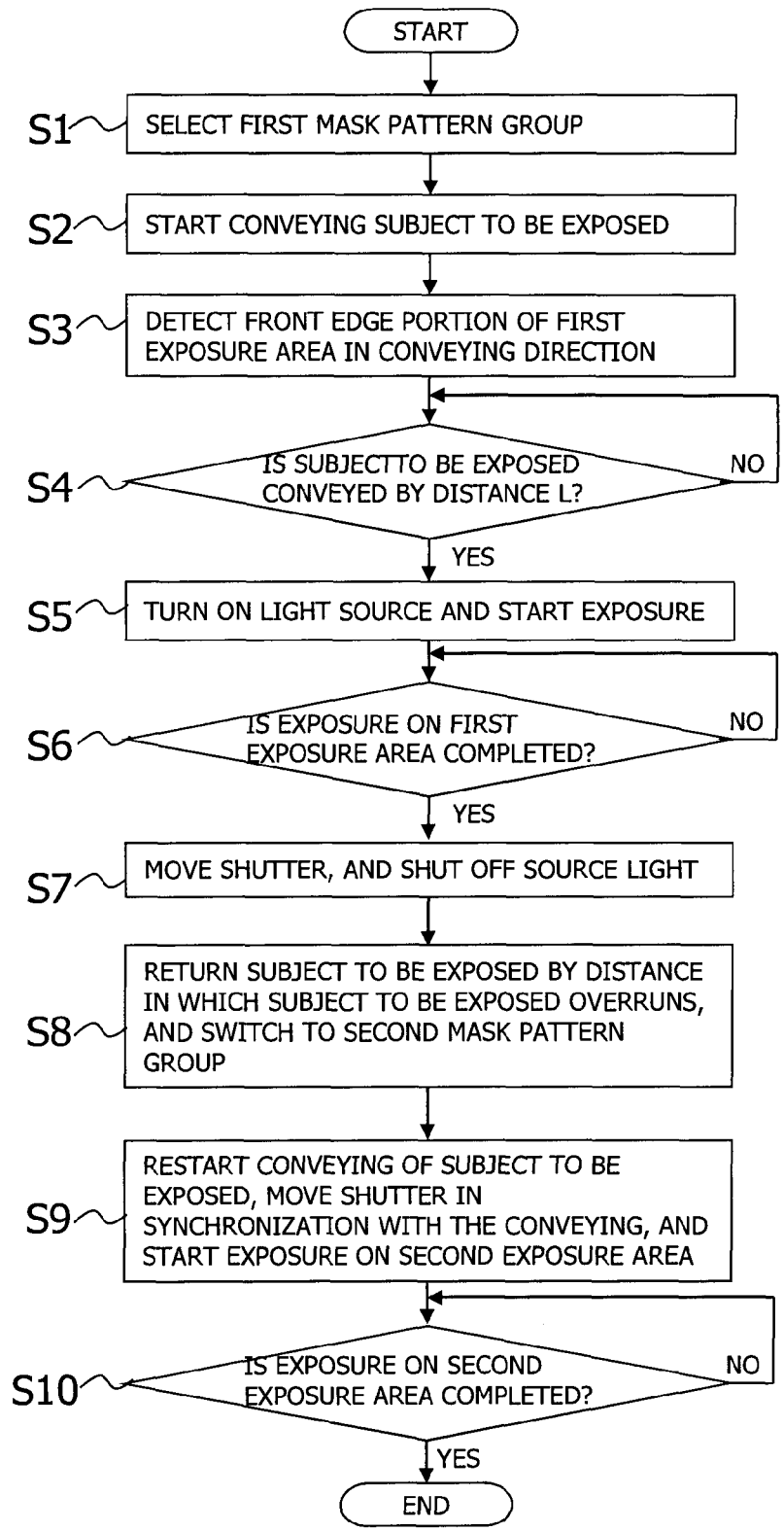
FIG. 5 is a flowchart of an exposure method of the present invention.

Next, an operation of the exposure apparatus configured as described above and an exposure method performed by using the exposure apparatus will be described with reference to FIG. 5. Here, a case will be described in which the first exposure area 9 and the second exposure area 10, on the each surfaces of which different exposure patterns are formed, are set on the subject to be exposed 8 at a predetermined interval in the conveying direction.

First, in step S1, the mask stage 4 stops at a standby position and the first mask pattern group 12 of the photomask 11 is selected. The shutter 5 stops at a standby position and the shut off of the source light 23 is released.

In step S2, the conveying device 1 is controlled and driven in a forward direction by the conveying device drive controller 18, and an operation for conveying the subject to be exposed 8 in the arrow A direction at a predetermined speed is started.

In step S3, the image processing unit 14 performs image processing on an image of the surface of the subject to be exposed 8 captured by the imaging device 6, and a front edge portion of a reference pattern group, which includes a plurality of reference patterns formed in advance in the first exposure area 9, in the arrow A direction is detected at a front edge portion of the first exposure area 9 in the arrow A direction.

In step S4, after the front edge portion of the first exposure area 9 in the arrow A direction is detected on the basis of the output of the position sensor of the conveying device 1, the arithmetic unit 16 calculates a distance in which the subject to be exposed 8 moves. Then, the comparator 17 compares the calculated movement distance of the subject to be exposed 8 with the distance L read from the memory 15. If both distances correspond to each other and, in step S4, it is determined to be YES, the process proceeds to step S5.

In step S5, the light source drive controller 21 starts and turns on the light source 2. Then, the source light 23 which is emitted from the light source 2 and converted into parallel light through the coupling optical system 3 is irradiated to the first mask pattern group 12 of the photomask 11, and a first exposure pattern 24 is formed by exposure on the first exposure area 9 of the subject to be exposed 8 (see FIG. 6A).

In step S6, a movement distance of the subject to be exposed 8 is calculated by the arithmetic unit 16 on the basis of the output of the position sensor of the conveying device 1, the distance is compared with the length of the first exposure area 9 in the arrow A direction read from the memory 15 by the comparator 17, and it is determined whether or not the distance and the length correspond to each other and the exposure on the first exposure area 9 is completed. If the distance and the length correspond to each other (see FIG. 6B) and "YES" is determined in step S6, the process proceeds to step S7.

In step S7, the shutter drive controller 20 starts and moves the shutter 5 in the arrow B direction in synchronization with the conveying speed of the subject to be exposed 8 (see FIG. 6C). When the source light 23 is completely shut off by the shutter 5, the movement of the shutter 5 is stopped and, at the same time, the conveying device 1 is stopped (see FIG. 6D).

In step S8, the conveying device 1 is driven in the reverse direction by the convey conveying device drive controller 18, and the subject to be exposed 8 is returned in the direction (arrow D direction) opposite to the arrow A direction by a distance in which the subject to be exposed 8 moves and overruns while the shutter 5 moves (see FIG. 6E). At the same time, the mask stage drive controller 19 is started, the mask stage 4 is moved in the arrow C direction, and the mask pattern group of the photomask 11 is switched from the first mask pattern group 12 to the second mask pattern group 13 (see FIG. 6E).

In step S9, the conveying device 1 is driven in the forward direction by the conveying device drive controller 18, the subject to be exposed 8 is conveyed again in the arrow A direction, and the shutter drive controller 20 is started to move the shutter 5 in the arrow B direction in synchronization with the conveying speed of the subject to be exposed 8 (see FIG. 6F). When the shut off of the source light 23 is completely released, the movement of the shutter 5 is stopped, and a second exposure pattern 25 is formed by exposure on the second exposure area 10 of the subject to be exposed 8 by the second mask pattern group 13 of the photomask 11 (see FIG. 6G).

In step S10, a movement distance of the subject to be exposed 8 is calculated by the arithmetic unit 16 on the basis of the output of the position sensor of the conveying device 1, the distance is compared with the length of the second exposure area 10 in the arrow A direction read from the memory 15 by the comparator 17, and it is determined whether or not the distance and the length correspond to each other and the exposure on the second exposure area 10 is completed. Here, if the distance and the length correspond to each other and "YES" is determined, the exposure ends. The light source 2 is turned off by the control of the light source drive controller 21 and the drive of the conveying device 1 is stopped by the control of the conveying device drive controller 18. Here, if a plurality of subjects to be exposed 8 is sequentially conveyed and exposure is continuously performed on the plurality of subjects to be exposed 8, the conveying device 1 is continuously driven.

Although, in the above embodiment, a case is described in which there are two exposure areas set on the subject to be exposed 8, the present invention is not limited to this, and there may be three or more exposure areas set on the subjects to be exposed 8. In this case, three or more mask pattern groups are arranged in the conveying direction of the subject to be exposed 8 (arrow A direction), and when step S10 is completed, the process returns to step S7, and steps S7 to S10 are repeatedly performed until the exposure on all the exposure areas is completed. In this case, it is preferred that a shutter in which a plurality of opening portions and light shielding portions are alternately formed in the movement direction (arrow B direction) is used as the shutter 5.

Although, in the above embodiment, a case is described in which the first and the second mask pattern groups 12 and 13 are arranged and formed in the conveying direction of the subject to be exposed 8 at a predetermined interval, the present invention is not limited to this, and the first and the second mask pattern groups 12 and 13 may be arranged and formed in a direction substantially perpendicular to the conveying direction of the subject to be exposed 8. In this case, the mask stage 4 moves in the direction substantially perpendicular to the conveying direction of the subject to be exposed 8, and the switching between the first and the second mask pattern groups 12 and 13 is performed.

Although, in the above embodiment, a case is described in which the embodiment is applied to a proximity exposure apparatus in which the photomask 11 is arranged to approach and face the subject to be exposed 8, the present invention is not limited to this, and the embodiment may be applied to a projection exposure apparatus in which the exposure is performed by projecting the mask pattern group of the photomask 11 onto the subject to be exposed 8. In this case, the movement direction of the shutter 5 is opposite to the conveying direction of the subject to be exposed 8.

It should be noted that the entire contents of Japanese Patent Application No. 2009-090617, filed on Apr. 3, 2009, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. An exposure method for forming a different exposure pattern on each of a plurality of exposure areas set on a subject to be exposed in a conveying direction of the subject to be exposed at a predetermined interval while conveying the subject to be exposed in one direction, the exposure method comprising the steps of:
   moving a shutter in synchronization with a conveying speed of the subject to be exposed and shutting off source light when exposure on one exposure area of the subject to be exposed is completed, the exposure being performed in a state in which a photomask is stopped by using one mask pattern group of the photomask in which a plurality of types of mask pattern groups corresponding to each exposure pattern is arranged and formed in the conveying direction of the subject to be exposed at a predetermined interval;
   moving the subject to be exposed backwards by a distance in which the subject to be exposed moves while the shutter moves, during shut-off of the source light, and switching the mask pattern group from the one mask pattern group to another mask pattern group by moving the photomask; and
   restarting the conveying of the subject to be exposed in the one direction, and at the same time, moving the shutter in synchronization with the conveying speed of the subject to be exposed to release shut-off of the source light, and perform exposure on the following exposure area, when the switching the mask pattern group from the one mask pattern group of the photomask to another mask pattern group is completed.

2. The exposure method according to claim 1, wherein the shutter is moved in the conveying direction of the subject to be exposed.

3. An exposure apparatus for forming a different exposure pattern on each of a plurality of exposure areas set on a subject to be exposed in a conveying direction of the subject to be exposed at a predetermined interval while conveying the subject to be exposed in one direction, the exposure apparatus comprising:
   a conveying device for conveying the subject to be exposed at a predetermined speed;
   a shutter which is formed to be able to move in synchronization with a movement of the subject to be exposed and which shuts off source light and releases shut-off of the source light; and
   a mask stage which is arranged to face an upper surface of the conveying device and which holds a photomask in which a plurality of types of mask pattern groups corresponding to each exposure pattern is formed and moves to perform switching of the plurality of types of mask pattern groups,
   wherein the shutter is moved in synchronization with a conveying speed of the subject to be exposed to shut off the source light when exposure on one exposure area of the subject to be exposed is completed, the exposure being performed in a state in which the photomask is stopped by using one mask pattern group of the photomask,
   the conveying device moves the subject to be exposed backwards by a distance in which the subject to be exposed moves while the shutter moves, during shut-off of the source light, and the one mask pattern group of the photomask is switched to another mask pattern group by moving the mask stage, and
   the conveying of the subject to be exposed in the one direction is restarted, and at the same time, the shutter is moved to release shut-off of the source light, and exposure on the following exposure area is performed, when the switching the mask pattern group from the one mask pattern group of the photomask to another mask pattern group is completed.

4. The exposure apparatus according to claim 3, wherein the shutter is moved in the conveying direction of the subject to be exposed.

* * * * *